(12) United States Patent
Han et al.

(10) Patent No.: US 12,622,142 B2
(45) Date of Patent: May 5, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Linhong Han, Beijing (CN); Yi Qu, Beijing (CN); Yi Zhang, Beijing (CN); Chang Luo, Beijing (CN); Tingliang Liu, Beijing (CN); Youngyik Ko, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 756 days.

(21) Appl. No.: 17/921,635

(22) PCT Filed: Jul. 5, 2021

(86) PCT No.: PCT/CN2021/104491
§ 371 (c)(1),
(2) Date: Oct. 27, 2022

(87) PCT Pub. No.: WO2022/028181
PCT Pub. Date: Feb. 10, 2022

(65) Prior Publication Data
US 2023/0044101 A1     Feb. 9, 2023

(30) Foreign Application Priority Data
Aug. 3, 2020   (CN) .......................... 202010767100.2

(51) Int. Cl.
G06F 3/041        (2006.01)
G01R 31/28        (2006.01)
(Continued)

(52) U.S. Cl.
CPC ....... *H10K 59/131* (2023.02); *G01R 31/2836* (2013.01); *H10K 50/84* (2023.02); (Continued)

(58) Field of Classification Search
CPC ................ G01R 31/2836; G01R 31/54; G09G 2330/12; H10K 2102/311; H10K 50/84; (Continued)

(56) References Cited

U.S. PATENT DOCUMENTS

2014/0176844 A1*   6/2014  Yanagisawa .......... G02F 1/1309
                                                            349/43
2016/0322451 A1    11/2016  Park
                (Continued)

FOREIGN PATENT DOCUMENTS

CN        106848107 A      6/2017
CN        107527997 A     12/2017
                (Continued)

OTHER PUBLICATIONS

International Search Report for PCT/CN2021/104491 Mailed Oct. 9, 2021.
                (Continued)

*Primary Examiner* — Insa Sadio
(74) *Attorney, Agent, or Firm* — Ling Wu; Stephen Yang; Ling and Yang Intellectual Property

(57) ABSTRACT

A display panel and a display apparatus are provided, the display panel includes a substrate, a plurality of sub-pixels, a plurality of data lines, and a crack detection line. A first peripheral area surrounds a display area; the plurality of data lines are connected to the plurality of sub-pixels; and the crack detection line surrounds the display area, is arranged along the edge of the first peripheral area and a second peripheral region, and is connected to at least one of the plurality of data lines.

16 Claims, 5 Drawing Sheets

(51) Int. Cl.

| | | |
|---|---|---|
| *H10K 50/84* | (2023.01) |
| *H10K 59/131* | (2023.01) |
| *H10K 59/179* | (2023.01) |
| *H10K 77/10* | (2023.01) |
| *H10K 102/00* | (2023.01) |

(52) U.S. Cl.
CPC .......... *H10K 59/179* (2023.02); *H10K 77/111* (2023.02); *H10K 2102/311* (2023.02)

(58) Field of Classification Search
CPC .... H10K 59/131; H10K 59/179; H10K 59/65; H10K 77/111
See application file for complete search history.

(56) References Cited

U.S. PATENT DOCUMENTS

| | | | |
|---|---|---|---|
| 2017/0365650 A1 | 12/2017 | Kwon et al. | |
| 2018/0033354 A1* | 2/2018 | Lee ........................ | G09G 3/006 |
| 2018/0182274 A1 | 6/2018 | Jung et al. | |
| 2019/0057632 A1 | 2/2019 | Kim et al. | |
| 2023/0044101 A1 | 2/2023 | Han et al. | |

FOREIGN PATENT DOCUMENTS

| | | |
|---|---|---|
| CN | 109427273 A | 3/2019 |
| CN | 109493772 A | 3/2019 |
| CN | 109597226 A | 4/2019 |
| CN | 110021649 A | 7/2019 |
| CN | 111048021 A | 4/2020 |
| CN | 111048022 A | 4/2020 |
| CN | 111785658 A | 10/2020 |

OTHER PUBLICATIONS

Office Action dated Mar. 30, 2022 for Chinese Patent Application No. 202010767100.2 and English Translation.
Decision to grant dated Sep. 15, 2022 for Chinese Patent Application No. 202010767100.2 and English Translation.

* cited by examiner

111

113

113

1131

181

182

1

DISPLAY PANEL AND DISPLAY APPARATUS

CROSS-REFERENCE TO RELATED APPLICATIONS

The present application is a U.S. National Phase Entry of International Application PCT/CN2021/104491 having an international filing date of Jul. 5, 2021, which claims priority and benefits of the patent application No. 202010767100.2 filed to the CNIPA on Aug. 3, 2020, and the contents disclosed in the above-mentioned applications are hereby incorporated as a part of this application.

TECHNICAL FIELD

The present application relates to, but is not limited to, the field of display technologies, in particular to a display panel and a display apparatus.

BACKGROUND

With development of display technologies, display panels are gradually becoming miniaturized, such as for smart phones and smart watches. In order to adapt to installation of various functional components of a display apparatus, non-regular shape cut needs to be performed on a display panel. In a cutting process, due to an impact of a laser, cracks will easily easy to occur, and a display effect of a display panel with a crack is poor, which affects a product yield.

SUMMARY

Embodiments of the present application provide a display panel and a display apparatus.

A display panel according to an embodiment of the present application includes a substrate, multiple sub-pixels, multiple data lines, and a crack detection line. The substrate includes a display region and a peripheral region surrounding the display region, the peripheral region includes a first peripheral region and a second peripheral region, the first peripheral region surrounds the display region, the second peripheral region is located on a side of the first peripheral region; the multiple sub-pixels are located in the display region; the multiple data lines are located in the display region and electrically connected to the multiple sub-pixels; the crack detection line is located on the substrate, the crack detection line surrounds the display region and is disposed along edge lines of the first peripheral region and the second peripheral region, the crack detection line is electrically connected to at least one of the multiple data lines.

In some embodiments, the peripheral region further includes a third peripheral region, wherein the third peripheral region is located on a side of the second peripheral region away from the display region, the crack detection line is disposed along an edge line of the third peripheral region, and an area of the third peripheral region is larger than an area of the second peripheral region.

In some embodiments, the crack detection line is electrically connected to two of the multiple data lines, and two endpoints of the crack detection line are electrically connected to the two data lines, respectively.

In some embodiments, the display panel further includes multiple first pads located in the third peripheral region, wherein the multiple first pads include a first detection pad, the first detection pad is electrically connected to the crack detection line, and the first detection pad includes at least one of the multiple first pads.

In some embodiments, the first pads are configured to receive a test signal to control the test signal to be transmitted through the crack detection line to the at least one data line.

In some embodiments, the crack detection line includes a first trace segment and a second trace segment, the first trace segment and the second trace segment are symmetrically disposed relative to the display region, and the two of the data lines include a first data line and a second data line, the first trace segment is electrically connected to the first data line, and the second trace segment is electrically connected to the second data line.

In some embodiments, the display panel further includes multiple second pads, wherein the multiple second pads are located on a side of the multiple first pads, the multiple second pads include a second detection pad, the second detection pad is electrically connected to the crack detection line, and the second detection pad includes at least one of the multiple second pads.

In some embodiments, the multiple second pads are configured to be electrically connected to a drive chip, and the drive chip receives an input signal to control display of the sub-pixels connected to the data lines.

In some embodiments, the display panel further includes multiple third pads, the multiple third pads are located on a side of the multiple second pads away from the display region, the multiple third pads include a third detection pad, the third detection pad is electrically connected to the crack detection line, the third detection pad includes at least one of the multiple third pads, and the third detection pad is located between the multiple first pads and the multiple second pads.

In some embodiments, the crack detection line includes a first trace segment, a second trace segment, and a third trace segment, the third trace segment is connected to the first trace segment and the second trace segment, the third trace segment is located between the multiple second pads and the display region, and the first detection pad, the second detection pad, and the third detection pad are all electrically connected to the third trace segment.

In some embodiments, the display panel further includes a crack blocking structure, the crack blocking structure is located at an edge of the peripheral region and located on a side of the crack detection line away from the display region to block a crack in the display panel in a process of non-regular shape cutting.

In some embodiments, the crack blocking structure includes a retaining wall, and the retaining wall is located on the substrate.

In some embodiments, a boundary of the first peripheral region forms a circle having a notch, and the second peripheral region is connected to the notch.

In some embodiments, the second peripheral region is in a shape of a rectangle, and opposite boundaries of the second peripheral region are connected to the first peripheral region and the third peripheral region, respectively.

In some embodiments, the third peripheral region includes a trace region and a pad region that are connected, the trace region is in a shape of a trapezoid, the pad region is in a shape of a rectangle, the third trace segment is located in the trace region, the multiple first pads, the multiple second pads, and the multiple third pads are located in the pad region.

In some embodiments, the substrate includes a flexible substrate or a rigid substrate.

The display apparatus of the present application includes a display panel. The display panel includes a substrate, multiple sub-pixels, multiple data lines, and a crack detection line. The substrate includes a display region and a peripheral region surrounding the display region, wherein the peripheral region includes a first peripheral region and a second peripheral region, the first peripheral region surrounds the display region and the second peripheral region is located on a side of the first peripheral region; the multiple sub-pixels are located in the display region; the multiple data lines are located in the display region and electrically connected to the multiple sub-pixels; being located on the substrate, the crack detection line surrounds the display region and is disposed along edge lines of the first peripheral region and the second peripheral region, and the crack detection line is electrically connected to at least one of the multiple data lines.

The display panel and the display apparatus according to the embodiment of the present application are provided with the crack detection line on an edge line of the peripheral region of the display panel, when a crack occurs in the peripheral region, the crack detection line will be broken, a signal transmitted by the crack detection line is affected, thereby whether there is a crack occurring is determined according to whether a sub-pixel electrically connected to the crack detection line is lit up, which may accurately detect whether the display panel is damaged during non-regular shape cutting, help quality inspection staff to screen out the display panel with a poor display effect, and ensure a product yield.

Additional aspects and advantages of the embodiments of the present application will be partially shown or become apparent in the following description, or will be learned from practice of the embodiments of the present application.

BRIEF DESCRIPTION OF DRAWINGS

The above mentioned and/or additional aspects and advantages of the present application will become apparent and easily understandable from following description of the embodiments in conjunction with accompanying drawings.

The above mentioned and/or additional aspects and advantages of the embodiments of the present application will become apparent and easily understandable from following description of the embodiments in conjunction with accompanying drawings.

DETAILED DESCRIPTION

Embodiments of the present application are further described below with reference to the accompanying drawings. Same or similar reference numbers in the accompanying drawings always represent same or similar components or components with same or similar functions.

In addition, the embodiments of the present application described below with reference to the accompanying drawings are exemplary, used for explaining the embodiments of the present application only, and should not be construed as limitations on the present application.

In the present application, unless otherwise clearly specified and defined, a first feature being "on" or "under" a second feature may mean that the first and second features are in direct contact, or the first and second features are in indirect contact through an intermediate medium. Moreover, the first feature being "over", "above" and "on" the second feature may mean that the first feature is directly above or obliquely above the second feature, or simply mean that a level of the first feature is greater than that of the second feature. The first feature being "below", "beneath" and "under" the second feature may mean that the first feature is directly below or obliquely below the second feature, or simply mean that a height of a level of the first feature is less than that of the second feature.

At present, non-regular shape cut generally uses a high-power density laser beam to irradiate a material to be cut (such as a display panel of the present application), so that the material is quickly heated to a vaporization temperature and evaporated to form a hole. At the same time, a molten material is blown away with help of high-speed airflow which is coaxial with the beam, and a cutting slit is formed with movement of the material by the beam. It has characteristics of a high accuracy of a cutting size, no burr in an incision, no deformation in a cutting slit, a fast cutting speed, and no limitation on a processed shape, etc. It is expected to be widely applied in the field of non-regular shape cutting of a full screen, but it will have a shortage of a high cost in comparison. However, in a process of non-regular shape cutting, a special-shaped path of a laser is more likely to produce an unnecessary impact. On the other hand, a special-shaped display panel is vulnerable to physical extrusion and collision during cutting and manufacturing, and a risk of generating a crack is high. A display effect of a display panel having a crack may be affected, which may affect a product yield.

Figure 2:
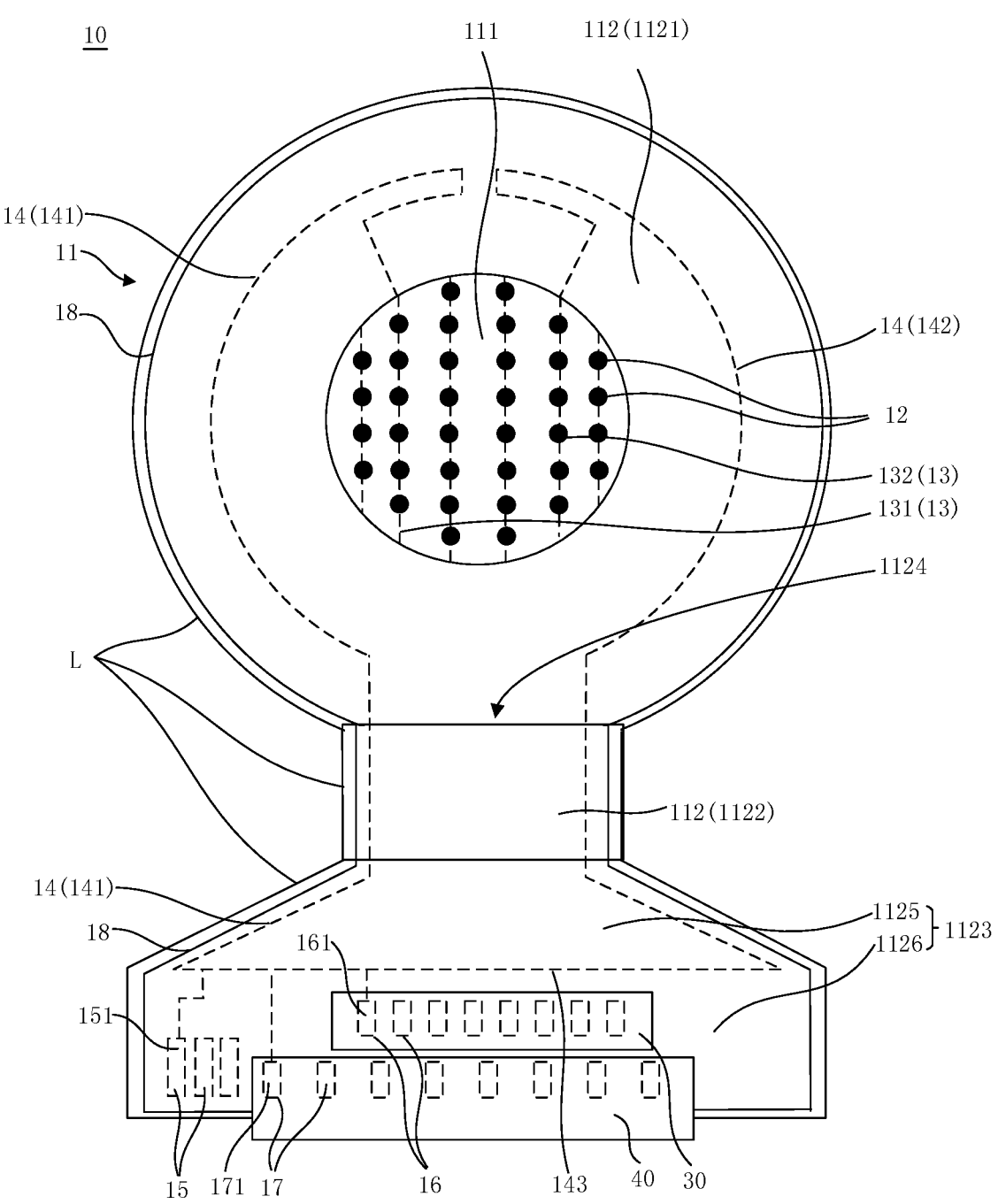
FIG. 2 is a schematic planar view of a display panel according to some embodiments of the present application.
Figure 3:
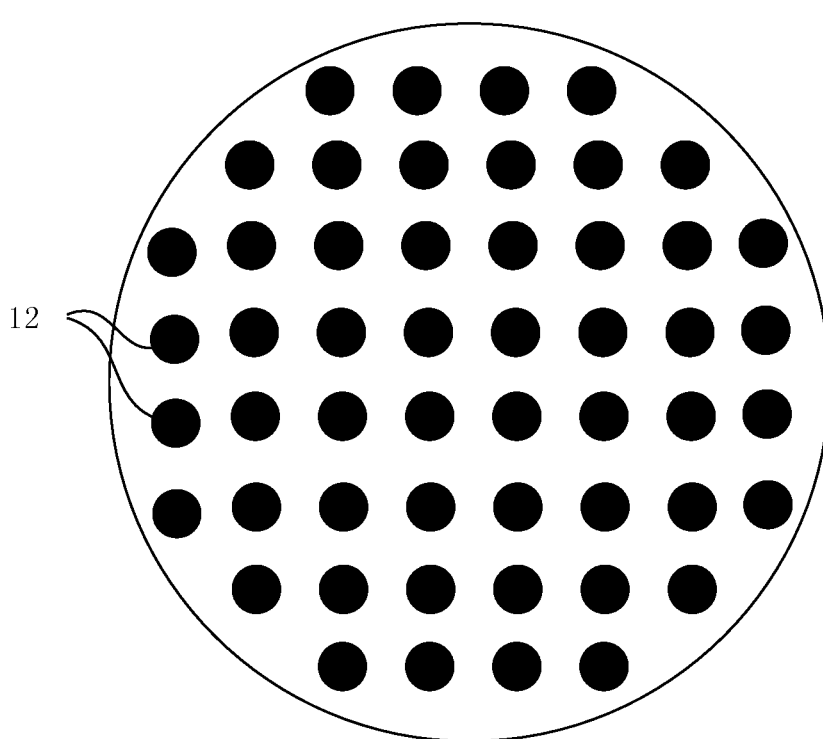
FIG. 3 is a schematic planar view of a display region when a crack detection line is intact according to some embodiments of the present application.

Referring to FIGS. 2 and 3, a display panel 10 of an embodiment of the present application includes a substrate 11, multiple sub-pixels 12, multiple data lines 13, and a crack detection line 14. The substrate 11 includes a display region 111 and a peripheral region 112 surrounding the display region 111. The peripheral region 112 includes a first peripheral region 1121 and a second peripheral region 1122, wherein the first peripheral region 1121 surrounds the display region 111, and the second peripheral region 1122 is located on one side of the first peripheral region 1121. The multiple sub-pixels 12 are located in the display region 111. The multiple data lines 13 are located in the display region 111 and electrically connected to the multiple sub-pixels 12. The crack detection line 14 is located on the substrate 11, the crack detection line 14 surrounds the display region 111 and is disposed along edge lines L of the first peripheral region 1121 and the second peripheral region 1122, and the crack detection line 14 is electrically connected to at least one of the multiple data lines 13.

The display panel 10 according to the embodiment of the present application is provided with the crack detection line 14 on an edge line L of the peripheral region 112 of the display panel 10, when a crack occurs in the peripheral region 112, the crack detection line 14 will be broken, a signal transmitted by the crack detection line 14 is affected, thereby whether there is a crack appearing in the peripheral region 112 is determined according to whether a sub-pixel 12 electrically connected to the crack detection line 14 is lit up, which may accurately detect whether the display panel 10 is damaged during non-regular shape cutting, help quality inspection staff to screen out the display panel 10 with a poor display effect, and ensure a product yield.

Figure 1:
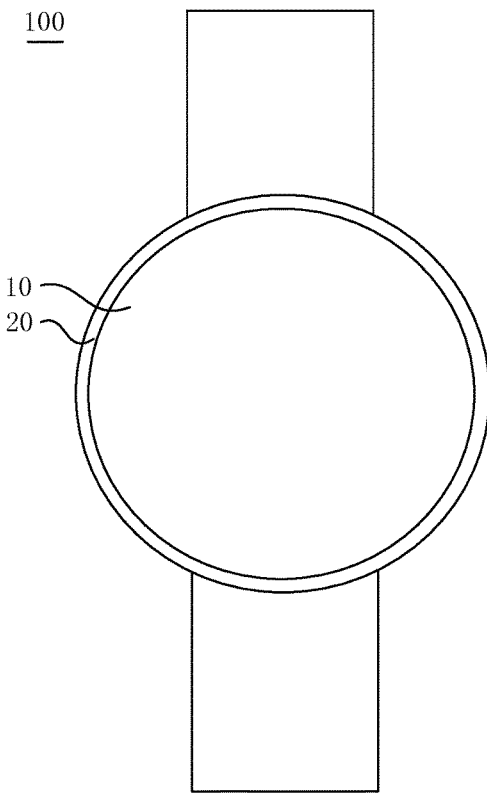
FIG. 1 is a schematic planar view of a display apparatus according to some embodiments of the present application.

Referring to FIGS. 1 and 2, a display apparatus 100 according to an embodiment of the present application includes a display panel 10 and a drive chip 30. The display panel 10 is provided on a cabinet 20.

Specifically, the display apparatus 100 may be an electronic apparatus having a display function, such as a mobile phone, a tablet computer, a laptop computer, a smart bracelet, a smart watch, or another wearable device. In the embodiment shown in FIG. 1, the display apparatus 100 is a smart watch, and a dial of the smart watch is in a shape of any one of a circle, a rectangle, and a rounded rectangle, wherein the rounded rectangle is a rectangle with four rounded corners, and in other embodiments, the dial of the smart watch may also be in any other shape, which is not limited herein. As shown in FIG. 1, in the embodiment of the present application, the dial of the smart watch is circular.

The cabinet 20 may be used for installation of the display panel 10, or may serve as an installation carrier for the display panel 10. The display apparatus 100 includes a front side and a back side which are opposite to each other, and there is one display panel 10 which may be disposed on the front side. There may also be multiple (e.g. two) display panels 10 which are provided at the front side and the back side simultaneously. In the embodiment of the present application, the display panel 10 is disposed on the front side. The cabinet 20 may also be used for installing functional modules such as a power supply apparatus and a communication apparatus of the display apparatus 100. After the cabinet 20 and the display panel 10 are installed together, a closed accommodation space is formed to accommodate the functional modules such as the power supply apparatus and the communication apparatus, so as to provide dust-proof, fall-proof, and waterproof protection for the functional modules.

Referring to FIG. 2, the drive chip 30 is provided on the display panel 10, and the drive chip 30 may be an Integrated Circuit (IC) chip. The drive chip 30 is used for controlling the display panel 10 to display an image.

Referring to FIG. 2, the display panel 10 includes a substrate 11, sub-pixels 12, data lines 13, a crack detection line 14, first pads 15, second pads 16, third pads 17, and a crack blocking structure 18.

The display panel 10 may be an Organic Light Emitting Diode (OLED) display panel 10. An organic light emitting diode is used for the Organic Light Emitting Diode display panel 10 for display, which may achieve self-luminescence, so that each pixel may independently perform light emission control, and a display function may be achieved without a backlight lamp. The OLED display panel 10 has advantages of lightness, thinness, low energy consumption, high brightness, good light emitting rate, and the like.

The substrate 11 may be a rigid substrate 11 such as a glass substrate 11, or a flexible substrate 11 such as a flexible resin substrate. A drive circuit and display pixels are integrated on the flexible substrate 11, so that a flexible display panel 10 may be made. A shape of the flexible display panel 10 may be a rectangle, a circle, an ellipse, or any other irregular shape, which is not limited herein. In addition, the OLED display panel 10 may also form a transparent display panel 10 having good light transmittance to meet more display requirements.

The substrate 11 includes a display region 111 and a peripheral region 112. The peripheral region 112 surrounds the display region 111.

The display region 111 is a region for display, and multiple sub-pixels 12 in the display region 111 form a pixel array. The drive chip 30 is connected to the pixel array through data lines 13 of the display region 111, and is used for driving the pixel array to work according to an input signal to achieve displaying an image.

The display region 111 may be a rectangle, a circle, a rounded rectangle, etc., the multiple sub-pixels 12 are all located in the display region 111, and the pixel array in which the multiple sub-pixels 12 are arranged may be a matrix, a circular array, or an array with another shape, and may be set according to a shape of the display region 111, which is no limited herein.

Multiple data lines 13 are further formed in the display region 111, that is, the multiple data lines 13 are located within the display region 111. Each data line 13 is electrically connected to one or more sub-pixels 12 to receive an input signal to achieve light emission control of the one or more sub-pixels 12 connected to the data line 13.

Referring to FIG. 2, the peripheral region 112 includes a first peripheral region 1121, a second peripheral region 1122, and a third peripheral region 1123.

The first peripheral region 1121 surrounds the display region 111, wherein a boundary of the first peripheral region 1121 forms a circle with a notch 1124.

The second peripheral region 1122 is located on one side of the first peripheral region 1121, specifically the second peripheral region 1122 is located on a side of the first peripheral region 1121 away from the display region 111 and connected to the notch 1124. The second peripheral region 1122 is in a shape of a rectangle, and a length of a side of the rectangle connected to the notch 1124 is equal to a width of the notch 1124.

The third peripheral region 1123 is located on a side of the second peripheral region 1122 away from the display region 111. An area of the third peripheral region 1123 is larger than that of the second peripheral region 1122, the second peripheral region 1122 is used for being bent so that the third peripheral region 1123 is located below the first peripheral region 1121 and the display region 111, and the second peripheral region 1122 occupies a small area, which is beneficial to miniaturization of the display apparatus 100.

After bending, the area of the third peripheral region 1123 is smaller than a sum of areas of the first peripheral region 1121 and the display region 111, so that an area of a projection of the bent display panel 10 on a horizontal surface is a sum of areas of the first peripheral region 1121 and the display region 111, thereby facilitating miniaturization of the display apparatus 100.

The third peripheral region 1123 includes a trace region 1125 and a pad region 1126, wherein the trace region 1125 is connected to the second peripheral region 1122. The trace region 1125 is in a shape of a trapezoid, and an upper base of the trapezoid coincides with a side opposite to the side connected to the notch 1124 in the second peripheral region 1122. The trace region 1125 is connected to the pad region 1126, the pad region 1126 is in a shape of a rectangle, and a long side of the rectangle coincides with a lower base of the trace region 1125.

Referring to FIG. 2, the crack detection line 14 is located on the substrate 11, and the crack detection line 14 surrounds the display region 111 and is disposed along edge lines L of the first peripheral region 1121 and the second peripheral region 1122. It may be understood that when non-regular shape cutting is performed on the display panel 10, the display panel 10 is cut along a preset cutting line, and an edge line L of the display panel 10 after the cutting is the cutting line. If a damaged occurs at the cut, the crack detection line 14 provided along the edge line L is broken. According to a distribution of the cutting line, when a preset cutting line also exists at an edge of the third peripheral region 1123, the crack detection line 14 may also be provided at an edge line L of the third peripheral region 1123, thereby ensuring that crack detection may be performed at all parts of the non-regular shape cut and improving detection accuracy.

The crack detection line includes a first trace segment 141, a second trace segment 142, and a third trace segment 143. The first trace segment 141 and the second trace segment 142 are arranged symmetrically with respect to the display region 111. The third trace segment 143 is located in the third peripheral region 1123 and located between the multiple second pads 16 and the display region 111 (i.e., the trace region 1125), and the third trace segment 143 connects two endpoints of the first trace segment 141 and the second trace segment 142.

Two endpoints of the crack detection line 14 are respectively electrically connected to two data lines 13, specifically, the two data lines 13 are respectively a first data line 131 and a second data line 132, wherein an endpoint of the first trace segment 141 that is not connected to the third trace segment 143 is electrically connected to the first data line 131, and an endpoint of the second trace segment 142 that is not connected to the third trace segment 143 is electrically connected to the second data line 132.

It may be understood that when the crack detection line 14 is intact, displayed contents of the display region 111 when a detection signal is inputted to the crack detection line 14 are obviously different from displayed contents of the display region 111 after the crack detection line 14 is broken and when a detection signal is input to the crack detection line 14, and subsequently, quality inspection staff only need to input a test signal to the crack detection line 14 during detection, so that whether a crack appears in the display panel 10 may be quickly and accurately determined according to different displayed contents.

For example, the crack detection line 14 is connected to multiple sub-pixels 12 of a certain row or column of the pixel array and each sub-pixel 12 may include a red sub-pixel, a green sub-pixel, and a blue sub-pixel. The red sub-pixel may emit red light, the green sub-pixel may emit green light, and the blue sub-pixel may emit blue light. By controlling brightness of the red sub-pixel, the green sub-pixel, and the blue sub-pixel, light emitted by a corresponding sub-pixel 12 may be mixed to form visible light of different colors, and then the sub-pixel 12 may display a corresponding color. Or the crack detection line 14 independently controls the red sub-pixel, the green sub-pixel, or the blue sub-pixel, and whether or not a crack occurs in the crack detection line 14 is determined by determining whether or not the red sub-pixel, the green sub-pixel, or the blue sub-pixel is lit up.

Figure 4:
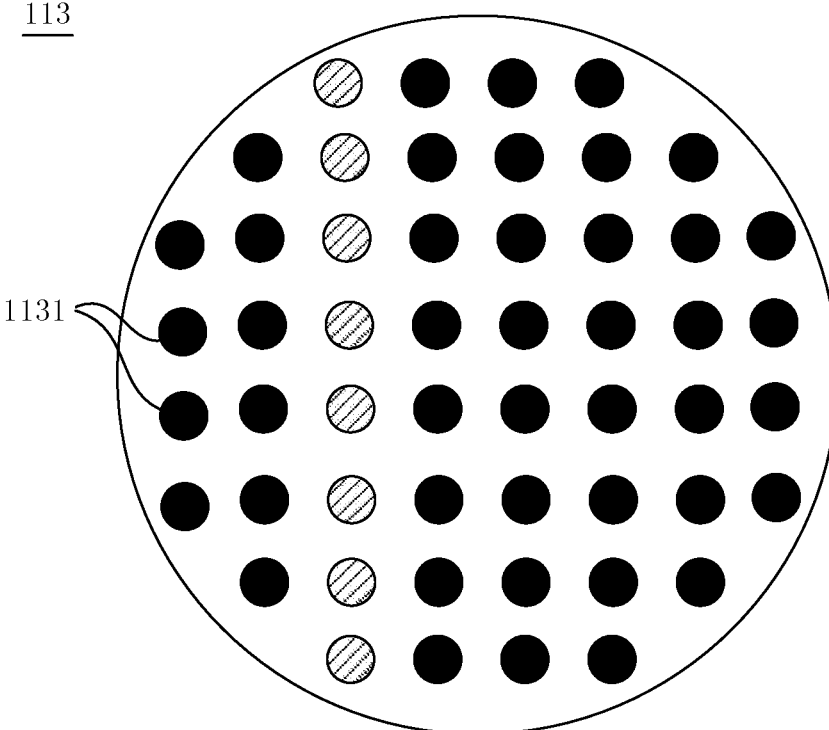
FIG. 4 is a schematic planar view of a display region when a first trace segment is damaged according to some embodiments of the present application.
Figure 5:
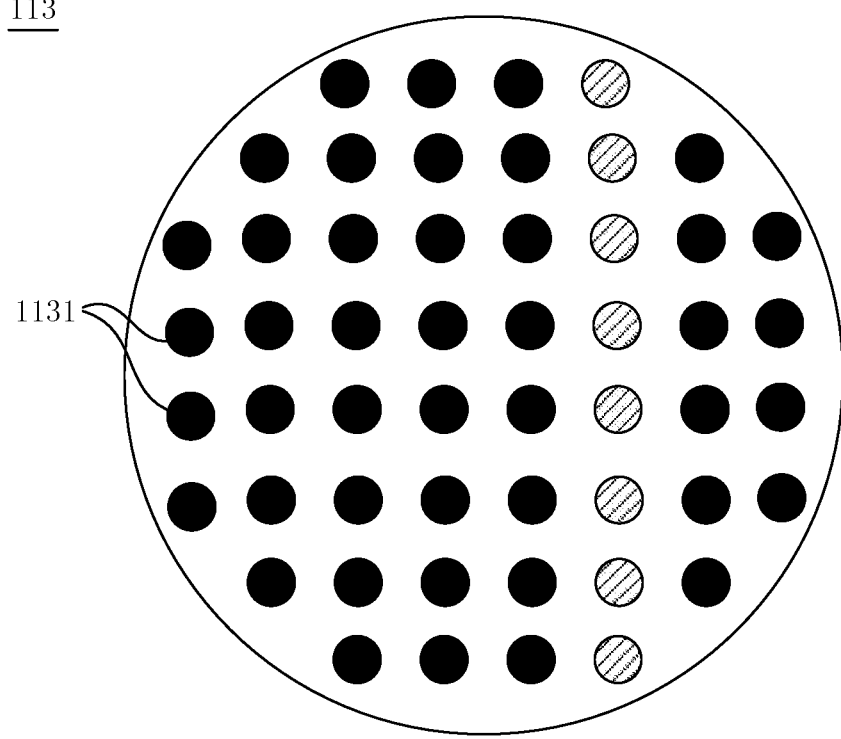
FIG. 5 is a schematic planar view of a display region when a second trace segment is damaged according to some embodiments of the present application.

However, the first trace segment 141 and the second trace segment 142 are respectively connected to two different data lines 13, when neither the first trace segment 141 nor the second trace segment 142 is damaged, sub-pixels 12 (as shown in a third column in FIG. 3) connected to the first data line 131 and sub-pixels 12 (as shown in a sixth column in FIG. 3) connected to the second data line 132 are both lit up. When the first trace segment 141 is damaged, sub-pixels 12 (as shown in a third column in FIG. 4) connected to the first data line 131 display a predetermined color (such as green) to indicate a damage situation of a region corresponding to the first trace segment 141 in the display panel 10, after the second trace segment 142 is damaged, sub-pixels 12 (as shown in a sixth column in FIG. 5) connected to the second data line 132 display a predetermined color (such as green) to indicate a damage situation of a region corresponding to the second trace segment 142 in the display panel 10. Therefore, when determining a damage situation of the display panel 10, a region where a crack appears is accurately determined.

Referring to FIG. 2 the first pads 15 are located in the third peripheral region 1123 (specifically the pad region 1126). Multiple first pads 15 are provided, among which there is one or more first detection pads 151 for achieving crack detection, and a first detection pad 151 is electrically connected to the crack detection line 14.

The first detection pad 151 is configured to receive a test signal, then, control an input signal to be transmitted to at least one data line 13 through the crack detection line 14. In this embodiment, after the first pad 15 receives the test signal, the test signal is transmitted to the crack detection line 14 through the first pads 15, and then transmitted to the first data line 131 and the second data line 132 connected to the crack detection line 14.

The second pads 16 are located in the third peripheral region 1123 (specifically the pad region 1126) and configured to be electrically connected to the drive chip 30. Multiple second pads 16 are provided, in which there are one or more second detection pads 161 for achieving crack detection are present, and a second detection pad 161 is electrically connected to the crack detection line 14.

The drive chip 30 receives the test signal, then transmits it to the crack detection line 14 through the second detection pad 161, and then transmits it to the first data line 131 and the second data line 132 to which the crack detection line 14 is connected, thereby achieving display control of sub-pixels 12 corresponding to the first data line 131 and the second data line 132.

The drive chip 30 is disposed in the third peripheral region 1123 and covers multiple second pads 16. The drive chip 30 may also receive an input signal and transmit it to all the data lines 13 through the second pads 16, thereby achieving control of displayed contents of the display region 111.

The third pads 17 are located in the third peripheral region 1123 (specifically, in the pad region 1126, on a side of the multiple second pads 16 away from the display region 111). Multiple third pads 17 are provided, among the multiple third pads 17, there are one or more third detection pads 171 for detecting whether the drive chip 30 can output an accurate output signal after receiving an input signal. A third detection pad 171 is electrically connected to the crack detection line 14. After the drive chip 30 receives an input signal, the input signal is transmitted to the third trace segment 143 through the second detection pad 161, thereby the signal is transmitted to the third detection pad 171. The display apparatus 100 (shown in FIG. 1) further includes a circuit board 40, the third pads 17 are electrically connected to the circuit board 40, the circuit board 40 covers multiple third pads. An output signal output from a third pad 17 (i.e., the third detection pad 171) may be acquired through the circuit board 40. By comparing the output signal acquired from the third detection pad 171 with a predetermined signal, it is possible to determine whether the drive chip 30 can output an accurate output signal according to a difference between the output signal and the predetermined signal.

Referring to FIG. 2, a crack blocking structure 18 is located at an edge of the peripheral region 112. Specifically, the crack blocking structure 18 may be disposed along an edge line L of the peripheral region 112 and located on a side of the crack detection line 14 away from the display region 111 to block a crack in the display panel 10 in a process of non-regular shape cutting.

For example, the crack blocking structure 18 is disposed along an edge line L of the first peripheral region 1121 and an edge line L of the second peripheral region 1122; or, the crack blocking structure 18 may be disposed along the edge line L of the first peripheral region 1121, the edge line L of the second peripheral region 1122, and an edge line L of the third peripheral region 1123, and the like, which is not limited herein, and may be set according to a region where crack detection is required. In this embodiment, the crack blocking structure 18 is disposed along the edge line L of the first peripheral region 1121, the edge line L of the second peripheral region 1122, and the edge line L of the third peripheral region 1123, and surrounds the crack detection line 14.

The crack blocking structure 18 is disposed on the substrate 11, and is used for offsetting a part of stress generated by non-regular shape cutting when the display panel 10 is cut to be shaped, and the crack blocking structure 18 is disposed along an edge line L of the peripheral region 112, thereby pertinently offsetting a stress in vicinity of the edge line L during the non-regular shape cutting, and the display panel 10 may be prevented from being damaged during the non-regular shape cutting without providing the crack blocking structure 18 on the entire substrate 11.

The crack blocking structure 18 is disposed on a side of the crack detection line 14 away from an edge of the display region 111, so that the crack detection line 14 detects whether the display panel 10 is damaged or not after the crack blocking structure 18 offsets a stress, and accuracy is higher.

The crack blocking structure 18 is in a form of a retaining wall (i.e. the crack blocking structure 18 includes a retaining wall 181), the retaining wall 181 is formed by extending from the substrate 11 toward a direction away from the substrate 11 and protrudes from the substrate 11.

One or more retaining walls 181 may be provided, and when one retaining wall 181 is provided, wherein a shape of the retaining wall 181 is substantially the same as a shape enclosed by an edge line L (i.e., a shape combined by the first peripheral region 1121, the second peripheral region 1122, and the third peripheral region 1123), the retaining wall 181 is disposed along the edge line L, and the retaining wall 181 and the edge line L are spaced apart by a predetermined distance. Thus, the retaining wall 181 may better offset a stress generated during non-regular shape cutting and prevent a crack from occurring in the display panel 10.

Figure 6:
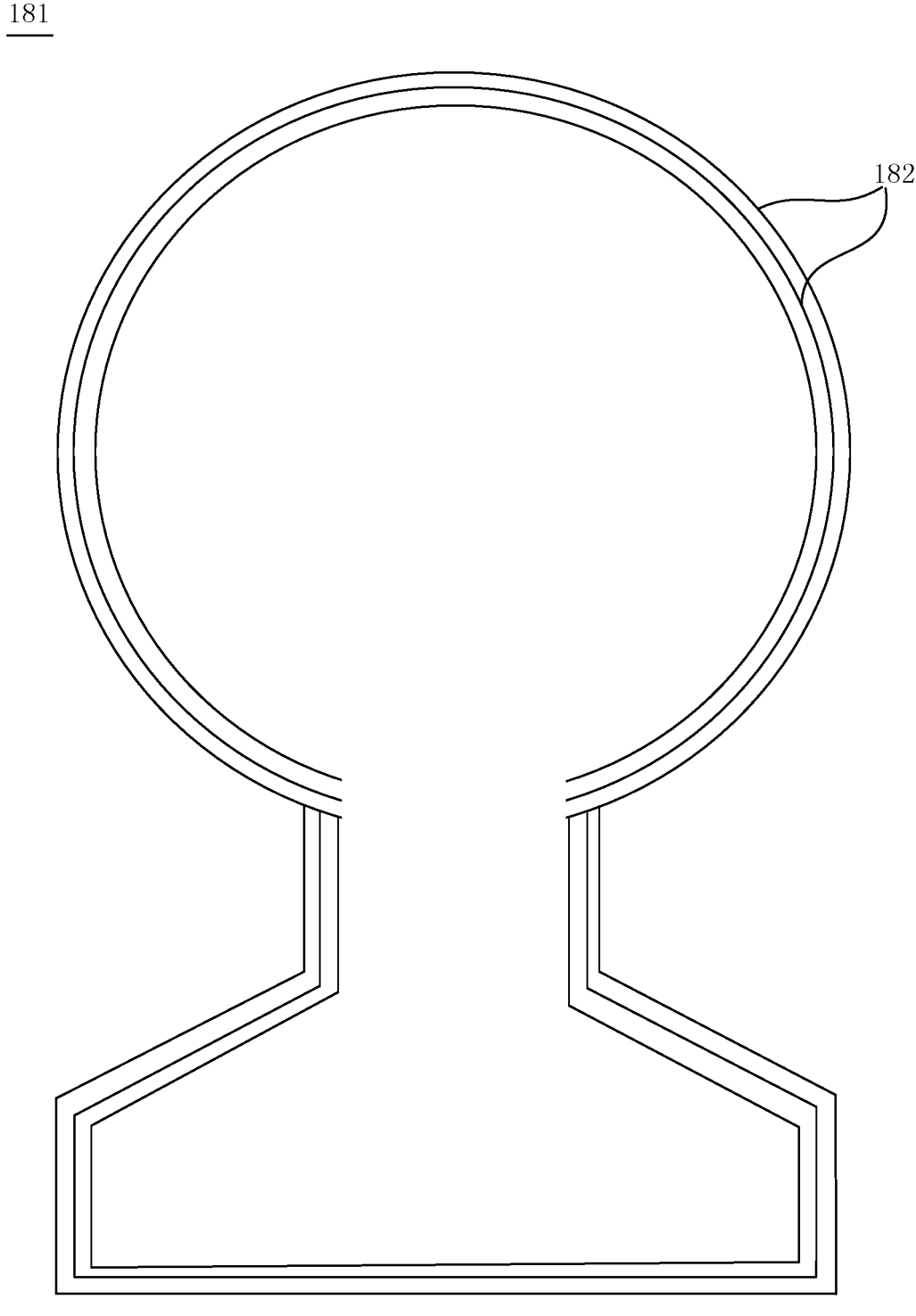
FIG. 6 is a schematic diagram of a structure of a retaining wall according to some embodiments of the present application.

Referring to FIG. 6, the retaining wall 181 may further include multiple sub-retaining walls 182, wherein shapes of the multiple sub-retaining walls 182 are substantially the same as those enclosed by the edge line L to form a multi-layer structure, and two adjacent sub-retaining walls 182 are spaced apart by a predetermined distance. Compared with a single-layer retaining wall 181, which only weakens a stress caused by non-regular shape cutting once, multiple layers of sub-retaining walls 182 (as shown in FIG. 6, three layers of sub-retaining walls 182) are arranged in sequence and spaced apart by a predetermined distance, so that a stress caused by the non-regular shape cutting may be weakened several times, thereby better preventing a crack from occurring in the display panel 10.

When multiple retaining walls 181 are provided, the multiple retaining walls 181 are arranged sequentially along the edge line L, thereby offsetting a stress generated at the edge line L during non-regular shape cutting and preventing a crack from occurring in the display panel 10. Compared with an annular seamless structure formed by a single retaining wall 181 with substantially the same shape surrounded by the edge line L, there are gaps among the multiple retaining walls 181, occupying a smaller space of the display panel 10, and gaps between adjacent retaining walls 181 may be used for wiring.

The display panel 10 and the display apparatus 100 according to the embodiment of the present application are provided with the crack detection line 14 on an edge line L of the peripheral region 112 of the display panel 10. When a crack occurs in the peripheral region 112, the crack detection line 14 will be broken, a signal transmitted by the crack detection line 14 is affected, thereby whether there is a crack occurring is determined according to whether a sub-pixel 12 electrically connected to the crack detection line 14 is lit up, which may accurately detect whether the display panel 10 is damaged during non-regular shape cutting, help quality inspection staff to screen out the display panel 10 with a poor display effect, and ensure a product yield. Moreover, the crack blocking structure 18 occupies a smaller space and may play a role in preventing the display panel 10 from being damaged due to the non-regular shape cutting. In addition, the cabinet 20 can play a role in protecting an assembled display panel 10 to a certain extent.

In descriptions of the specification, descriptions of reference terms "some embodiments", "one embodiment", "several embodiments", "an exemplary embodiment", "an example", "a specific example", or "some examples" intend to indicate that specific features, structures, materials, or characteristics described in connection with embodiments or examples are contained in at least one embodiment or example of the present application. In this specification, schematic expressions of the above terms do not necessarily refer to a same embodiment or example. Moreover, the specific features, structures, materials, or characteristics described may be combined in any one or more embodiments or examples in a proper way.

In addition, the terms "first" and "second" are used for descriptive purposes only and cannot be interpreted as indicating or implying relative importance or implicitly indicating the number of technical features indicated. Thus, features defined by "first" and "second" may explicitly or implicitly include at least one feature. In descriptions of the present application, "multiple" refers to at least two, for example, two or three, unless otherwise specifically limited.

Although the embodiments of the present application have been shown and described above, it should be understood that the above embodiments are exemplary, and will not be understood as limitations on the present application. Alterations, modifications, substitutions and variations to the above embodiments may be made by those skilled in the art within the scope of the present application. The scope of the present application is defined by the claims and their equivalents.

The invention claimed is:

1. A display panel, comprising:
a substrate comprising a display region and a peripheral region surrounding the display region, wherein the peripheral region comprises a first peripheral region and a second peripheral region, the first peripheral region surrounds the display region, and the second peripheral region is located on a side of the first peripheral region;

a plurality of sub-pixels located in the display region;

a plurality of data lines located in the display region and electrically connected to the plurality of sub-pixels; and a crack detection line located on the substrate, wherein the crack detection line surrounds the display region and is disposed along edge lines of the first peripheral region and the second peripheral region, and the crack detection line is electrically connected to at least one of the plurality of data lines;

wherein the peripheral region further comprises a third peripheral region, the third peripheral region is located on a side of the second peripheral region away from the display region, the crack detection line is disposed along an edge line of the third peripheral region, and an area of the third peripheral region is larger than an area of the second peripheral region.

2. The display panel according to claim 1, wherein the crack detection line is electrically connected to two of the plurality of data lines and two endpoints of the crack detection line are electrically connected to the two data lines, respectively.

3. The display panel according to claim 2, wherein the crack detection line comprises a first trace segment and a second trace segment, the first trace segment and the second trace segment are symmetrically disposed relative to the display region, and the two of the data lines comprise a first data line and a second data line, the first trace segment is electrically connected to the first data line, and the second trace segment is electrically connected to the second data line.

4. The display panel according to claim 1, further comprising a plurality of first pads located in the third peripheral region, wherein the plurality of first pads comprise a first detection pad, the first detection pad is electrically connected to the crack detection line, and the first detection pad comprises at least one of the plurality of first pads.

5. The display panel according to claim 4, wherein the first pads are configured to receive a test signal to control the test signal to be transmitted through the crack detection line to the at least one data line.

6. The display panel according to claim 4, further comprising a plurality of second pads, wherein the plurality of second pads are located on a side of the plurality of first pads, the plurality of second pads comprise a second detection pad, the second detection pad is electrically connected to the crack detection line, and the second detection pad comprises at least one of the plurality of second pads.

7. The display panel according to claim 6, wherein the plurality of second pads are configured to be electrically connected to a drive chip, and the drive chip receives an input signal to control display of the sub-pixels connected to the data lines.

8. The display panel according to claim 6, further comprising a plurality of third pads, the plurality of third pads are located on a side of the plurality of second pads away from the display region, the plurality of third pads comprise a third detection pad, the third detection pad is electrically connected to the crack detection line, the third detection pad comprises at least one of the plurality of third pads, and the third detection pad is located between the plurality of first pads and the plurality of second pads.

9. The display panel according to claim 8, wherein the crack detection line comprises a first trace segment, a second trace segment, and a third trace segment, the third trace segment is connected to the first trace segment and the second trace segment, the third trace segment is located between the plurality of second pads and the display region, and the first detection pad, the second detection pad, and the third detection pad are all electrically connected to the third trace segment.

10. The display panel according to claim 9, wherein the second peripheral region is in a shape of a rectangle, and opposite boundaries of the second peripheral region are connected to the first peripheral region and the third peripheral region, respectively.

11. The display panel according to claim 10, wherein the third peripheral region comprises a trace region and a pad region that are connected, the trace region is in a shape of a trapezoid, the pad region is in a shape of a rectangle, the third trace segment is located in the trace region, the plurality of first pads, the plurality of second pads, and the plurality of third pads are located in the pad region.

12. The display panel according to claim 1, further comprising a crack blocking structure, the crack blocking structure is located at an edge of the peripheral region and located on a side of the crack detection line away from the display region to block a crack in the display panel in a process of non-regular shape cutting.

13. The display panel according to claim 12, wherein the crack blocking structure comprises a retaining wall and the retaining wall is located on the substrate.

14. The display panel according to claim 1, wherein a boundary of the first peripheral region forms a circle having a notch, and the second peripheral region is connected to the notch.

15. The display panel according to claim 1, wherein the substrate comprises a flexible substrate or a rigid substrate.

16. A display apparatus, comprising the display panel according to claim 1.

* * * * *